United States Patent [19]

Claverie et al.

[11] Patent Number: 5,091,209
[45] Date of Patent: Feb. 25, 1992

[54] METHOD OF FORMING A THIN COPPER FILM BY LOW TEMPERTURE CVD

[75] Inventors: Pierre Claverie, Boulogne Billancourt, France; Masao Kimura, Minatomachi; Juichi Arai, Shiraumemito, both of Japan; Pierre Jalby, La Marne, France

[73] Assignee: L'Air Liquide, Societe Anonyme Pour L'tude et L'Exploitation des Procedes Georges Claude, Paris, France

[21] Appl. No.: 596,001

[22] Filed: Oct. 11, 1990

[30] Foreign Application Priority Data

Oct. 12, 1989 [JP] Japan .................. 1-264101

[51] Int. Cl.$^5$ .................. C23C 16/06; C23C 16/08; C23C 16/48
[52] U.S. Cl. .................. 427/38; 427/250; 427/252; 427/253; 427/255.1
[58] Field of Search .................. 427/38, 39, 252, 253, 427/250, 255.1; 204/192.31

[56] References Cited

U.S. PATENT DOCUMENTS

| | | | |
|---|---|---|---|
| 4,842,891 | 6/1989 | Miyazaki et al. | 427/38 |
| 4,873,119 | 10/1989 | Akhtar et al. | 427/39 |
| 4,948,623 | 8/1990 | Beach et al. | 427/253 |
| 4,960,072 | 10/1990 | Ohta et al. | 427/38 |

FOREIGN PATENT DOCUMENTS

| | | |
|---|---|---|
| 3905297 | 8/1990 | Fed. Rep. of Germany . |
| 574737 | 1/1946 | United Kingdom . |

*Primary Examiner*—Shrive Beck
*Assistant Examiner*—Margaret Burke
*Attorney, Agent, or Firm*—Oblon, Spivak, McClelland, Maier & Neustadt

[57] ABSTRACT

A thin copper film is formed by CVD, by (a) forming a gas stream containing a copper halide, followed by introducing said gas stream into a CVD reaction chamber having a heated catalytic metal filament arranged herein, (b) introducing hydrogen gas into the CVD reaction chamber for activation of said hydrogen gas by the heated catalytic metal filament, and (c) carrying out the reaction between the copper halide contained in the gas stream introduced in step (a) and the hydrogen activated in step (b) near the surface of a substrate arranged within the CVD reaction chamber so as to deposit a thin copper film of copper on the substrate surface.

13 Claims, 4 Drawing Sheets

METHOD OF FORMING A THIN COPPER FILM BY LOW TEMPERTURE CVD

BACKGROUND OF THE INVENTION

1. Field of the Invention

The present invention relates to a method of forming a thin copper film on the surface of a substrate by means of low temperature CVD.

2. Description of the Background

The technique of forming a thin copper film on the substrate surface is highly useful in various fields. For example, a thin copper film can be formed on the surface of a ceramic substrate by metallization. A ceramic substrate such as an alumina substrate is widely used as a packaging material of an IC or as a substrate for mounting an IC. When the ceramic substrate is used in such applications, it is necessary to form a wiring pattern on the substrate surface. For the wiring pattern formation, copper metallization is applied in general to the substrate surface so as to form a thin conductive film.

An alumina ($Al_2O_3$) substrate is most widely used as a ceramic substrate. An alumina substrate exhibits excellent insulating properties, heat conductivity, resistance to chemicals, and mechanical strength, and is relatively cheap. On the other hand, marked progress is being made nowadays in the degree of integration, operating speed and output power of an IC, leading to a serious demand for a ceramic substrate with further improved heat-dissipating properties such as a substrate which is fully capable of acting as a heat sink. However, an alumina substrate normally has a heat conductivity of 10 to 35 W/mk and therefore fails to provide a sufficient heat sink function.

Beryllia (BeO) substrates and aluminum nitride (AlN) substrates are known as ceramic substrates which function fully as heat sinks. However, beryllia substrates, which have high heat conductivities ranging from 150 to 250 W/kb, are costly. In addition, BeO powder is poisonous which gives rise to difficulties in the manufacturing of beryllia substrates. On the other hand, aluminum nitride substrates have high heat conductivities on the order of 140 to 260 W/kb and have low manufacturing costs. In addition, AlN substrates exhibit excellent properties such as a low heat expansion coefficient, a high electrical insulation and a high mechanical strength. Thus, AlN substrates are expected to become more important in this field.

The technique of forming a thin copper film may also be applied to the coating of the surface of a stainless alloy plate with a thin copper film. Stainless alloys are already widely used. The application of a thin copper film coating is expected to further promote the use of stainless alloys. For example, the beautiful surface exhibited by a thin copper film coating makes stainless alloys suitable for use as a housing material, particularly, as an interior material and as an ornamental material. Stainless alloys exhibit poor solder wettability. However, solder wettability is markedly improved by the thin copper film coating, making it possible to use the stainless steel even in fields which require soldering. Further, the thin copper film coating eliminates the problem of stainless steel of having high electrical resistance. It follows that stainless steel coated with a thin copper film exhibits both the excellent spring properties of the stainless steel and the low electrical resistance of the copper film when the coated stainless steel is used in various applications such as in switches, terminals of a dry cell casing, and the like.

For forming a thin copper film on a substrate surface, various methods are known to the art including, for example, vacuum evaporation, sputtering, electroless plating, CVD and plasma CVD. However, it is necessary to heat the substrate to a temperature of 400° to 1,300° C. in each of these known methods except the electroless plating method and plasma CVD. Further, when it comes to the plasma CVD method, it is necessary to use a plasma generator which is very expensive. A need therefore continues to exist for an improved method of coating substrates with copper films.

SUMMARY OF THE INVENTION

Accordingly, one object of the present invention is to provide a method of forming a thin copper film on a substrate surface by CVD in which the substrate is held at a relatively low temperature.

Briefly, this object and other objects of the present invention as hereinafter will become more readily apparent and can be attained by a method of forming a thin copper film by CVD by (a) forming a gas stream containing a copper halide, following by introducing said gas stream into a CVD reaction chamber having a heated catalytic metal filament arranged therein, (b) introducing hydrogen gas into the CVD reaction chamber for activation of said hydrogen gas by the heated catalytic metal filament and (c) carrying out the reaction between the copper halide contained in the gas stream introduced in step (a) and the hydrogen activated in step (b) near the surface of a substrate arranged within the CVD reaction chamber so as to deposit a thin film of copper on the substrate surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Step (a)

Figure 1:
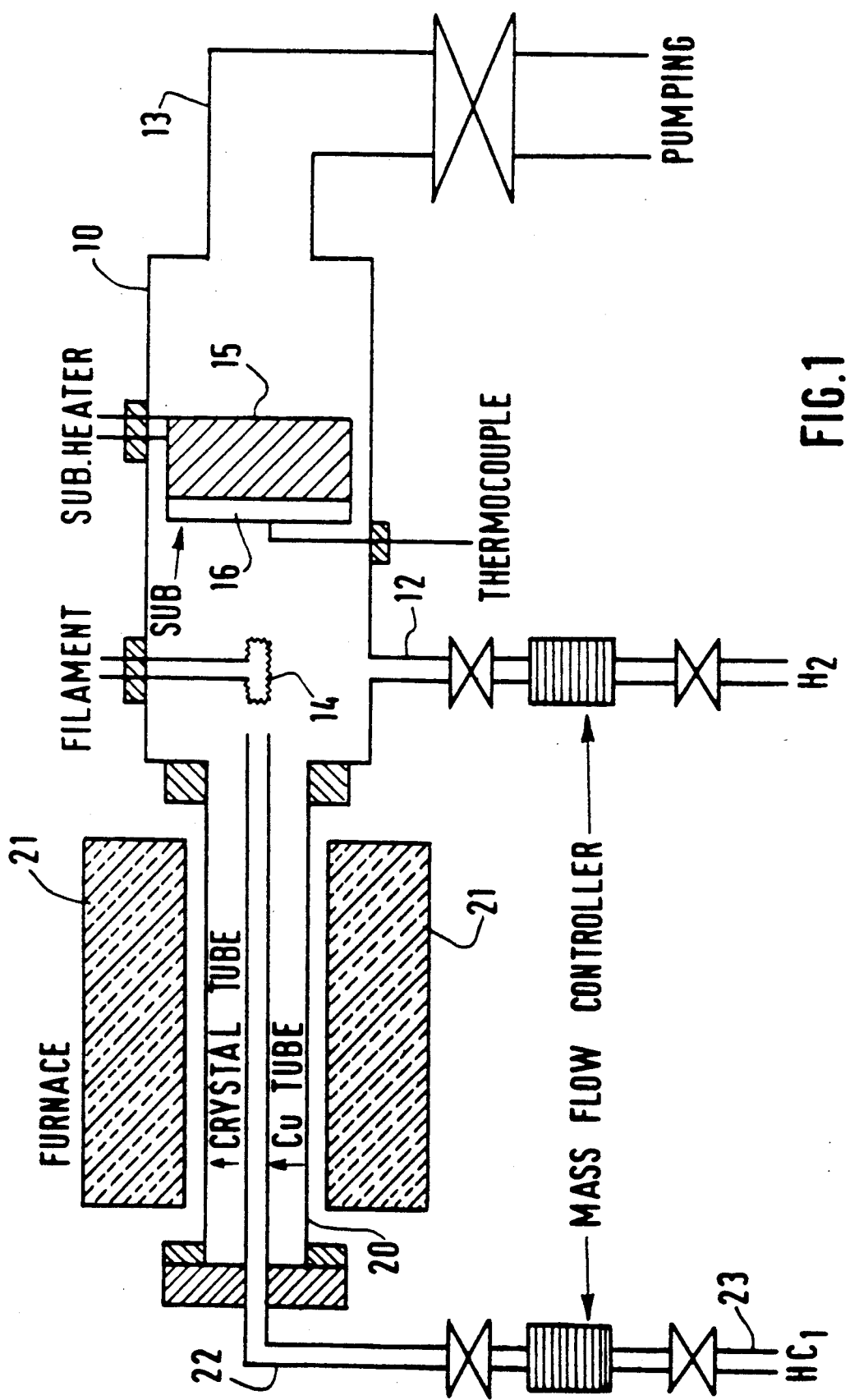
FIG. 1 shows the CVD apparatus used in the examples of the specification.

For the first step of the present process, an especially preferred, but not limiting, way to form a gas stream containing a copper halide is to continuously supply a halogen gas ($X_2$) or a hydrogen halide gas (HX) into a copper tube heated to, for example, about 1000° C. It is desirable to use a quartz furnace provided with an outer heater for heating the copper tube. The halogen gas or the hydrogen halide gas reacts with copper while flowing through the heated copper tube so as to form a copper halide (CuX or $CuX_2$). Chlorine (Cl) is a desirable halogen. It is particularly desirable to pass HCl gas through the copper tube. When HCl is passed through the tube, CuCl or $CuCl_2$ is formed within the halide, as shown below:

$$Cu + HCl \rightarrow CuCl + \tfrac{1}{2}H_2$$

$$Cu + 2HCl \rightarrow CuCl_2 + H_2$$

Note that $CuCl_2$ is converted into $CuCl$ at about 993° C.

The gas stream thus prepared is passed through a feed gas supply pipe into a CVD reaction chamber. A conventional reaction chamber used for such purposes can be used, except that a catalytic metal filament, which is described in detail in conjunction with step (b), should be positioned within the reaction chamber.

Another technique can be employed in step (a). In this method, a copper halide prepared in advance is evaporated, and the resultant copper halide gas is supplied to the reaction chamber through a suitable pipe or nozzle. It is also possible to use a carrier gas which does not adversely affect the CVD reaction, if necessary.

Step (b)

In the second step of the process, the hydrogen gas introduced into the CVD reaction chamber in step (b) serves to reduce the copper halide introduced therein in step (a). Concerning the activation mechanism of the hydrogen gas introduced in step (b), molecular hydrogen $H_2$ is believed to decompose into atomic hydrogen H by the action of the heated catalytic metal filament, as shown below:

$$H_2 \rightarrow 2H$$

The activation of the hydrogen gas makes it possible to deposit copper even on a substrate heated to a relatively low temperature, i.e., about 250° C. to about 300° C. Naturally, the activation step is most important in the present invention.

It is possible to use W, Ta, Mo, W alloy or the like as the catalytic metal. Also, it is desirable to heat the catalytic metal filament to about 800° C. to about 2000° C., preferably, to 1000° C. or more.

Step (c)

In the third step of the process, the copper halide introduced in step (a) is decomposed or reduced by the hydrogen gas activated in step (b), and the resultant copper is deposited on the substrate surface.

For example, the cuprous chloride and cupric chloride are reduced by activated hydrogen, as shown below:

$$CuCl + H \rightarrow Cu + HCl$$

$$CuCl_2 + 2H \rightarrow Cu + 2HCl$$

As described previously, cupric chloride is likely to decompose into cuprous chloride. Thus, it may be reasonable to understand that copper film formation occurs substantially by the reduction of cupric chloride.

Step (c) is equivalent to the similar step in the conventional CVD reaction, except that the reducing agent of hydrogen gas is activated in the present invention. Since the hydrogen gas is activated, it is possible to deposit copper on the substrate surface so as to form a thin copper film, even if the substrate temperature is markedly lower than in conventional CVD. To be more specific, a thin copper film can be formed satisfactorily in the present invention, if the substrate is heated to 250° C. to 300° C. in contrast to about 400° C. to 1300° C. required in the conventional CVD method. The thin copper film formation in the present invention under the substrate temperature of 250° to 300° C. is of great significance in view of the fact that it has been impossible to form a thin copper film in the prior art at a substrate temperature of 300° C. or less unless plasma CVD is employed.

The pressure within the CVD reaction chamber should generally be 0.1 to 10.0 Torr during the CVD reaction. Under a high pressure, a thick copper film can be obtained easily. However, large copper particles are deposited under a high pressure. For forming a thin film consisting of fine copper particles, it is desirable to set the pressure within the reaction chamber at 0.1 to 4.0 Torr, preferably, at 0.1 to 1.0 Torr.

The substrate on which a thin copper film is to be formed is not particularly restricted in the present invention. As described previously, a ceramic substrate such as an alumina substrate or an aluminum nitride substrate and a metal substrate such as a stainless steel substrate can be suitably used in the present invention. It is also possible to use a thermosetting resin substrate such as a polyimide substrate because the heating temperature is relatively low in the present process.

As described above in detail, the CVD method of the present invention makes it possible to form a thin copper film on the surface of a substrate while keeping the substrate temperature at a level which is markedly lower than the temperatures employed in the conventional method. It follows that the method of the present invention produces prominent effects in various fields, e.g., in the metallization of ceramic packages and ceramic substrates for mounting an IC, and in the copper coating of a stainless steel.

The present invention is directed to the formation of a copper thin film. However, the CVD method employed in the present invention is expected to be applicable to the formation of thin films of other metals.

Having generally described this invention, a further understanding can be obtained by reference to certain specific examples which are provided herein for purposes of illustration only and are not intended to be limiting unless otherwise specified.

The apparatus shown in FIG. 1 was used in the following examples. As shown in the drawing, the apparatus comprises a CVD reaction chamber 10 provided with a hydrogen gas supply pipe 12 and a discharge port 13. A tungsten filament 14 and a substrate heater 15 are arranged within the chamber 10. The filament 14 and the heater 15 are electrically energized. Further, a substrate 16 such as a ceramic substrate, on which a thin copper film is to be formed, is positioned on the substrate heater 15.

The apparatus also includes a quartz furnace 20 communicating with the reaction chamber 10. An outer heater 21 is disposed around the quartz furnace 20, and a copper pipe 22 is arranged in the furnace 20 such that one end portion of the pipe 22 is positioned outside the furnace 20. A HCl gas supply pipe 23 is connected to the end of the copper pipe 22 positioned outside the furnace 20, with the other end of the copper pipe 22 extending into the reaction chamber 10.

A thin copper film was actually formed by using the apparatus described above. In this experiment, the substrate 16 was heated to 250° C. Likewise, the copper pipe 22 and the W filament 14 were heated to 1000° C. and 1400° C., respectively. Further, the pressure within the chamber 10 was set at 1 Torr.

To be more specific, HCl gas was allowed to flow through the copper pipe 22 at a flow rate of 10 sccm, while heating the quartz furnace 20 with the outer heater 21. The resultant gas stream containing copper chloride (CuCl and/or CuCl)$_2$ was introduced into the reaction chamber 10 through the copper halide supply pipe 11. On the other hand, hydrogen gas was also introduced into the chamber 10 at a flow rate of 10 sccm in order to be activated by the W filament 14. The copper chloride was reduced within the reaction chamber 10 by the activated hydrogen gas, with the result that copper was deposited on the surface of the substrate 16. The deposition was carried out for 120 minutes.

A thin copper film was formed by the procedure described above on the surface of each of an alumina substrate (Example 1), an aluminum nitride substrate (Example 2) and a SUS 304 substrate (Example 3). A copper film about 1 μ thick was formed in each of these examples.

For comparison, a similar experiment was conducted in an attempt to form a thin copper film on the surface of each of an alumina substrate (Control 1), an aluminum nitride substrate (Control 2) and a SUS 304 substrate (Control 3), except that the W filament 14 was not used in these Control cases. A thin copper film was not formed on the substrate in these Control cases.

Figure 2:
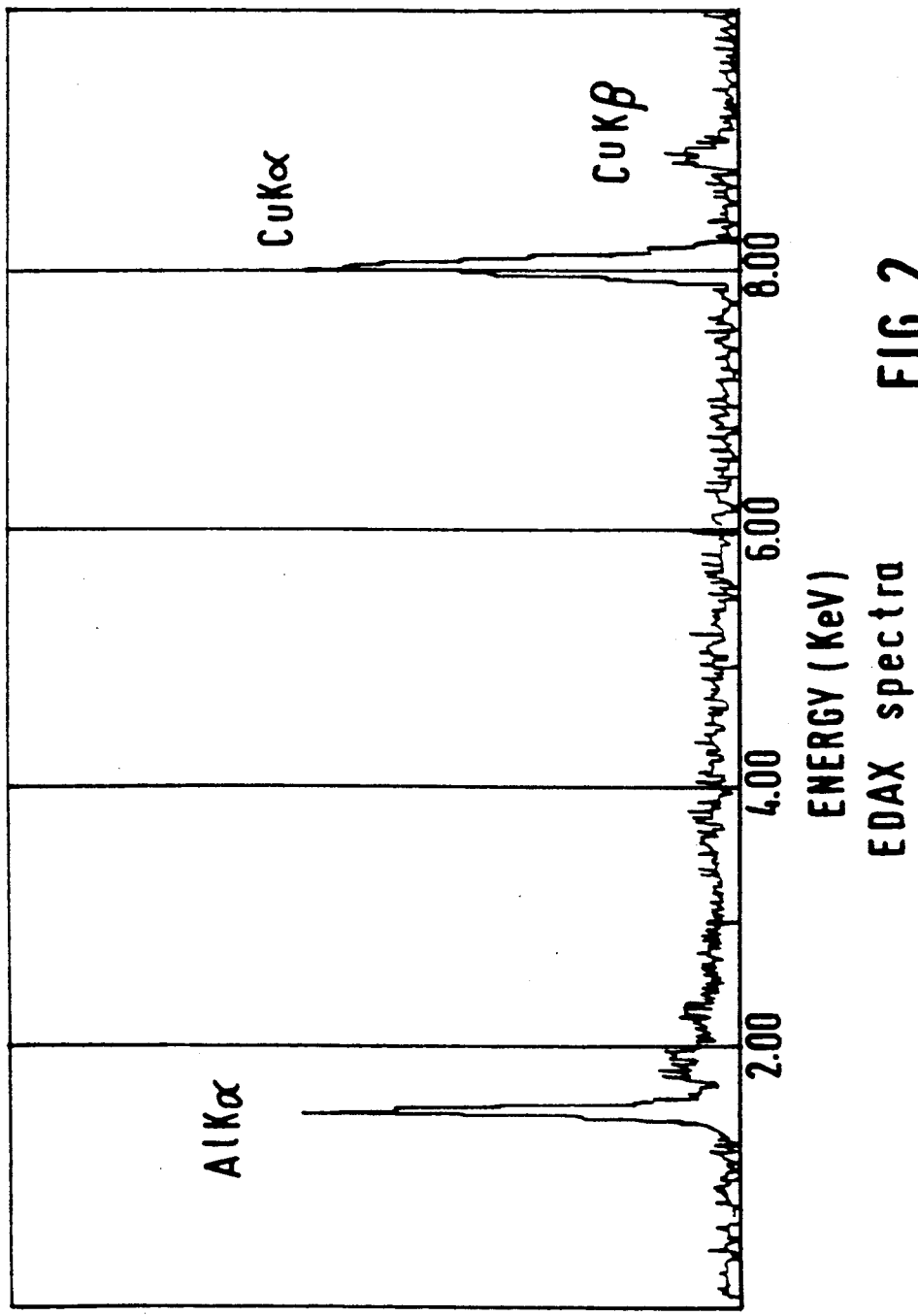
FIGS. 2, 3 and 4 show the results of EDAX spectral analysis, X-ray analysis and Auger analysis, respectively, as obtained from a thin copper film formed by an embodiment of the present invention.
Figure 3:
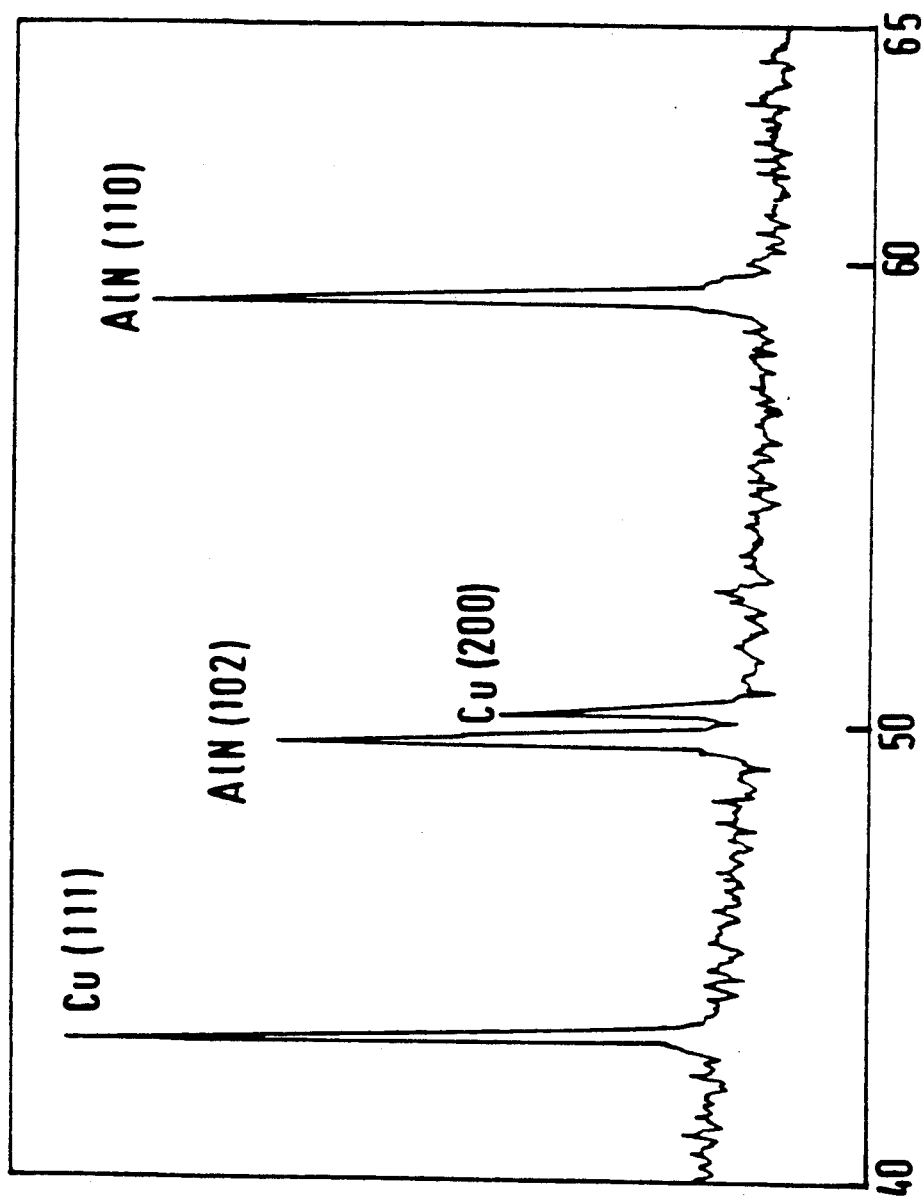
Figure 4:
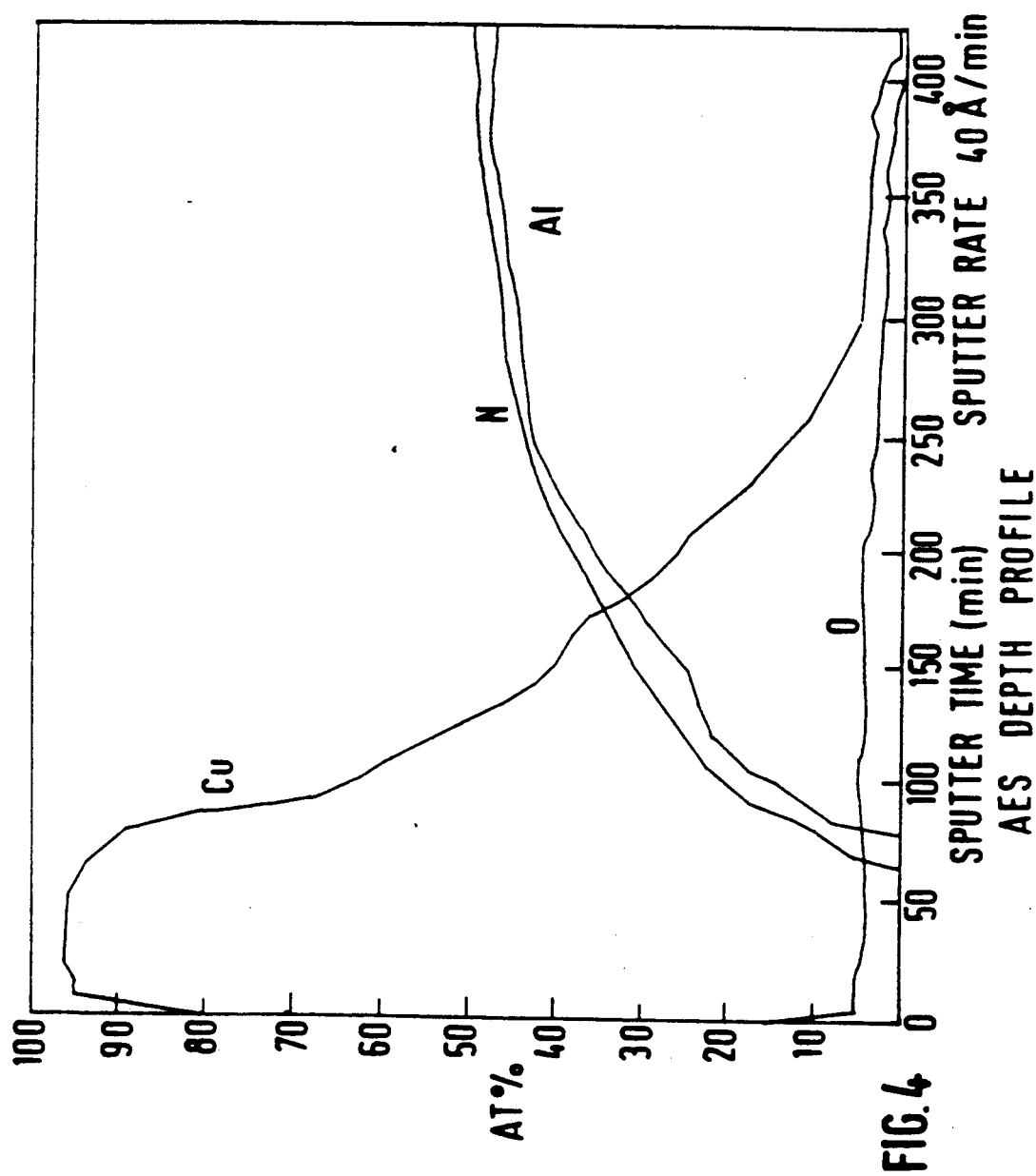

Then, the thin copper film formed on the surface of the aluminum nitride substrate in Example 2 was analyzed by EDAX spectrum analysis, X-ray analysis and Auger analysis. FIGS. 2–4 show the results. These analytical results clearly indicate that the thin copper film formed by the method of the present invention can be fully used in various fields.

Having now fully described the invention, it will be apparent to one of ordinary skill in the art that many changes and modifications can be made thereto without departing from the spirit or scope of the invention as set forth herein.

What is claimed as new and desired to be secured by Letters Patent of the United States is:

1. A method of forming a thin copper film by CVD, said method consisting essentially of the steps of:
   (a) forming a gas stream containing a copper halide, followed by introducing said gas stream into a CVD reaction chamber having a heated catalytic metal filament arranged therein;
   (b) introducing hydrogen gas into said CVD reaction chamber for activation of said hydrogen gas by said heated catalytic metal filament; and
   (c) carrying out a reaction between said copper halide contained in said gas stream introduced in step (a) and said hydrogen activated in step (b) near a surface of a substrate arranged within said CVD reaction chamber so as to deposit a thin film of copper on said substrate surface;
   wherein said substrate is maintained at a temperature of about 250° C. to about 300° C.

2. The method according to claim 1, wherein the substrate is selected from the group consisting of a ceramic substrate, a metal substrate, a glass substrate and a resin substrate.

3. The method according to claim 1, wherein the catalytic metal filament is formed of a metal selected from the group consisting of W, Ta, Mo and W alloy.

4. The method according to claim 1, wherein said gas stream containing a copper halide is prepared by continuously supplying a halogen gas or a hydrogen halide gas to a heated copper tube.

5. The method according to claim 4, wherein said gas stream containing a copper halide is prepared by continuously supplying hydrogen chloride gas to said heated copper tube.

6. The method according to claim 3, wherein said catalytic metal filament is heated to about 800° C. to about 2000° C.

7. The method according to claim 6, wherein said catalytic metal filament is heated to 1000° C. or more.

8. The method according to claim 1, wherein said CVD reaction chamber is maintained at a pressure of 0.1 to 10.0 Torr.

9. The method according to claim 8, wherein said pressure is 0.1 to 4.0 Torr.

10. The method according to claim 9, wherein said pressure is 0.1 to 1.0 Torr.

11. The method according to claim 2, wherein said ceramic substrate is alumina or aluminum nitride.

12. The method according to claim 2, wherein said metal substrate is stainless steel.

13. The method according to claim 2, wherein said resin substrate is a thermoset resin.

* * * * *

UNITED STATES PATENT AND TRADEMARK OFFICE
CERTIFICATE OF CORRECTION

PATENT NO. : 5,091,209

DATED : February 25, 1992

INVENTOR(S) : Fierre Claverie et al

It is certified that error appears in the above-identified patent and that said Letters Patent is hereby corrected as shown below:

ON THE TITLE PAGE:

Item [54] in the Title, change "TEMPERTURE" to --TEMPERATURE--.

Column 1, line 2, in the Title, change "TEMPERTURE" to --TEMPERATURE--.

Signed and Sealed this

Nineteenth Day of October, 1993

Attest:

BRUCE LEHMAN

Attesting Officer        Commissioner of Patents and Trademarks

UNITED STATES PATENT AND TRADEMARK OFFICE
CERTIFICATE OF CORRECTION

PATENT NO. : 5,091,209
DATED : FEBRUARY 25, 1992
INVENTOR(S) : PIERRE CLAVERIE ET AL

It is certified that error appears in the above-indentified patent and that said Letters Patent is hereby corrected as shown below:

On the title page, item [73], the Assignee's name should read --L'Air Liquide, Societe Anonyme Pour L'Etude et L'Exploitation des Precedes Georges Claude--.

Signed and Sealed this

Fifteenth Day of February, 1994

Attest:

BRUCE LEHMAN

*Attesting Officer*     Commissioner of Patents and Trademarks

UNITED STATES PATENT AND TRADEMARK OFFICE
CERTIFICATE OF CORRECTION

PATENT NO. : 5,091,209
DATED : February 25, 1992
INVENTOR(S) : Pierre Claverie et al It is certified that error appears in the above-indentified patent and that said Letters Patent is hereby corrected as shown below:

On the title page, item [73], the Assignee's name should read
--L'Air Liquide, Societe Anonyme Pour L'Etude et L'Exploitation des Procedes Georges Claude--.

This certificate supersedes Certificate of Correction issued February 15, 1994.

Signed and Sealed this

Fourteenth Day of June, 1994

*Attest:*

BRUCE LEHMAN

*Attesting Officer*     Commissioner of Patents and Trademarks